US012586712B2

(12) United States Patent

Nishikawa et al.

(10) Patent No.: US 12,586,712 B2

(45) Date of Patent: Mar. 24, 2026

(54) COMPOSITE ELECTRONIC COMPONENT

(71) Applicant: TDK CORPORATION, Tokyo (JP)

(72) Inventors: Tomonaga Nishikawa, Tokyo (JP);
Keigo Higashida, Tokyo (JP); **Masaki
Yoneyama, Tokyo (JP); Michitaka
Okazaki, Tokyo (JP); Masumi
Kameda**, Tokyo (JP)

(73) Assignee: TDK CORPORATION, Tokyo (JP)

( * ) Notice: Subject to any disclaimer, the term of this
patent is extended or adjusted under 35
U.S.C. 154(b) by 1190 days.

(21) Appl. No.: 17/506,996

(22) Filed: Oct. 21, 2021

(65) Prior Publication Data

US 2022/0148796 A1 May 12, 2022

(30) Foreign Application Priority Data

Nov. 12, 2020 (JP) ................................. 2020-188414

(51) Int. Cl.
 H01F 27/29 (2006.01)
 H01F 17/00 (2006.01)
 H01F 27/36 (2006.01)
 H03H 7/42 (2006.01)
(52) U.S. Cl.
 CPC ....... *H01F 27/292* (2013.01); *H01F 17/0013*
 (2013.01); *H01F 27/36* (2013.01); *H03H 7/42*
 (2013.01)
(58) Field of Classification Search
 CPC ............ H01F 17/0013; H01F 27/2804; H01F
 2027/2809; H01F 17/0006; H01F 5/003;
 H01F 27/29; H01F 27/292; H01F 27/36;
 H03H 7/09; H03H 7/42; H03H 2001/085

USPC ................................................... 336/200, 232
See application file for complete search history.

(56) References Cited

U.S. PATENT DOCUMENTS

| 2011/0140806 | A1* | 6/2011 | Taniguchi | ................ | H03H 7/09 |
| | | | | | 333/185 |
| 2016/0142031 | A1* | 5/2016 | Ueki | ...................... | H02H 9/045 |
| | | | | | 333/175 |
| 2016/0217917 | A1* | 7/2016 | Jeong | .................... | H01F 27/292 |
| 2017/0345551 | A1* | 11/2017 | Yoshioka | ............ | H01F 27/2804 |

FOREIGN PATENT DOCUMENTS

| JP | 2004304615 A | 10/2004 | |
| WO | WO-2014061351 A1 * | 4/2014 | ............. H03H 7/427 |

* cited by examiner

*Primary Examiner* — Tszfung J Chan
(74) *Attorney, Agent, or Firm* — YOUNG LAW FIRM,
P.C.

(57) ABSTRACT

Disclosed herein is a composite electronic component that
includes: a first coil pattern formed on at least a first
conductor layer, the first coil pattern having one end coupled
to the first terminal electrode and other end coupled to the
second terminal electrode; a second coil pattern formed on
at least a second conductor layer; a third coil pattern formed
on at least the first and second conductor layers, the third coil
pattern having one end coupled to the one end of the second
coil pattern and other end coupled to the third terminal
electrode; and a fourth coil pattern formed on at least the first
and second conductor layers, the fourth coil pattern having
one end coupled to the other end of the second coil pattern
and other end coupled to the fourth terminal electrode.

16 Claims, 8 Drawing Sheets

COMPOSITE ELECTRONIC COMPONENT

BACKGROUND OF THE INVENTION

Field of the Invention

The present invention relates to a composite electronic component and, more particularly, to a composite electronic component in which a balun transformer and an inductor are integrated into one chip.

Description of Related Art

JP 2004-304615A discloses a composite electronic component in which a balun transformer and an inductor are integrated into one chip. The composite electronic component described in JP 2004-304615A has a configuration in which a balun transformer, and filter and matching circuits connected to the balun transformer are integrated into one chip.

However, in the composite electronic component described in JP 2004-304615A, an element constituting the balun transformer and an element constituting the filter and matching circuits are stacked. This increases the number of conductor layers and makes mutual interference between the balun transformer and the filter and matching circuits likely to occur.

SUMMARY

It is therefore an object of the present invention to reduce the number of conductor layers and mutual interference between the balun transformer and the inductor in a composite electronic component in which the balun transformer and the inductor are integrated into one chip.

A composite electronic component according to the present invention is a composite electronic component having a plurality of stacked conductor layers including at least first and second conductor layers and includes: first to fourth terminal electrodes; a first coil pattern that is formed in the first conductor layer and whose one end and the other end are connected respectively to the first and second terminal electrodes; a second coil pattern that is formed in the second conductor layer so as to overlap the first coil pattern; a third coil pattern that is formed in the first and second conductor layers and whose one end and the other end are connected respectively to one end of the second coil pattern and the third terminal electrode; and a fourth coil pattern that is formed in the first and second conductor layers and whose one end and the other end are connected respectively to the other end of the second coil pattern and the fourth terminal electrode.

According to the present invention, the first and second coil patterns functioning as a balun transformer and the third and fourth coil patterns connected thereto are provided in the same layers, making it possible to reduce the number of conductor layers and to reduce mutual interference between the balun transformer and an inductor.

In the present invention, the third and fourth coil patterns may be smaller in diameter than the first and second coil patterns, the third and fourth coil patterns may be arranged in a first direction, and a group of the first and second coil patterns and a group of the third and fourth coil patterns may be arranged in a second direction perpendicular to the first direction. This can reduce the planar size of the composite electronic component.

In the present invention, the winding direction of the third coil pattern starting from the third terminal electrode and the winding direction of the fourth coil pattern starting from the fourth terminal electrode may be opposite to each other. Thus, magnetic fluxes generated by current flowing in the third and fourth coil patterns cancel each other, thus making it possible to reduce mutual interference between the third and fourth coil patterns.

In the present invention, the third and fourth coil patterns may be symmetric with respect to a virtual line extending in the second direction. This can make the third and fourth coil patterns substantially coincide with each other in characteristics.

In the present invention, the first and third terminal electrodes may be exposed to a first side surface, the second and fourth terminal electrodes may be exposed to a second side surface positioned opposite to the first side surface, and the winding direction of the first coil pattern starting from the first terminal electrode and the winding direction of the second coil pattern starting from the third terminal electrode may be opposite to each other. This can simplify the layout of winding patterns on a substrate mounting the composite electronic component according to the present invention.

In the present invention, the inner diameter areas of the first and second coil patterns may each be filled with a magnetic material. This can increase inductances of the first and second coil patterns.

In the present invention, the inner diameter areas of the third and fourth coil patterns may each be filled with a nonmagnetic material. This can prevent magnetic saturation of the third and fourth coil patterns.

In the present invention, a magnetic shield made of a magnetic material may be provided between a group of the first and second coil patterns and a group of the third and fourth coil patterns. This can further reduce mutual interference between the group of the first and second coil patterns and the group of the third and fourth coil patterns.

The composite electronic component according to the present invention may further include first and second magnetic layers made of a magnetic material and covering the first, second, third, and fourth coil patterns from both sides in the stacking direction of the coil patterns. This can further increase the inductances of the first and second coil patterns and increase a magnetic shield effect for the third and fourth coil patterns.

In the present invention, the plurality of conductor layers may further include third and fourth conductor layers, the first, second, third, and fourth conductor layers may be stacked in this order, the first coil pattern may be formed in the first and third conductor layers, the second coil pattern may be formed in the second and fourth conductor layers, the third coil pattern may be formed in the first, second, third, and fourth conductor layers, and the fourth coil pattern may be formed in the first, second, third, and fourth conductor layers. With this configuration, larger inductance can be obtained.

The composite electronic component according to the present invention may further include a fifth terminal electrode connected to one end of the second coil pattern and one end of the third coil pattern and a sixth terminal electrode connected to the other end of the second coil pattern and one end of the fourth coil pattern. Thus, by connecting a capacitor to the fifth and sixth terminal electrodes, a low-pass filter can be constituted. In this case, the fifth and sixth terminal electrodes may each be exposed to both surfaces on one side and the other side in the stacking direction. This allows a passive component, such as a capacitor, to be mounted on the top surface positioned opposite to the mounting surface.

As described above, according to the present invention, it is possible to reduce the number of conductor layers and mutual interference between the balun transformer and the inductor in a composite electronic component in which the balun transformer and the inductor are integrated into one chip.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
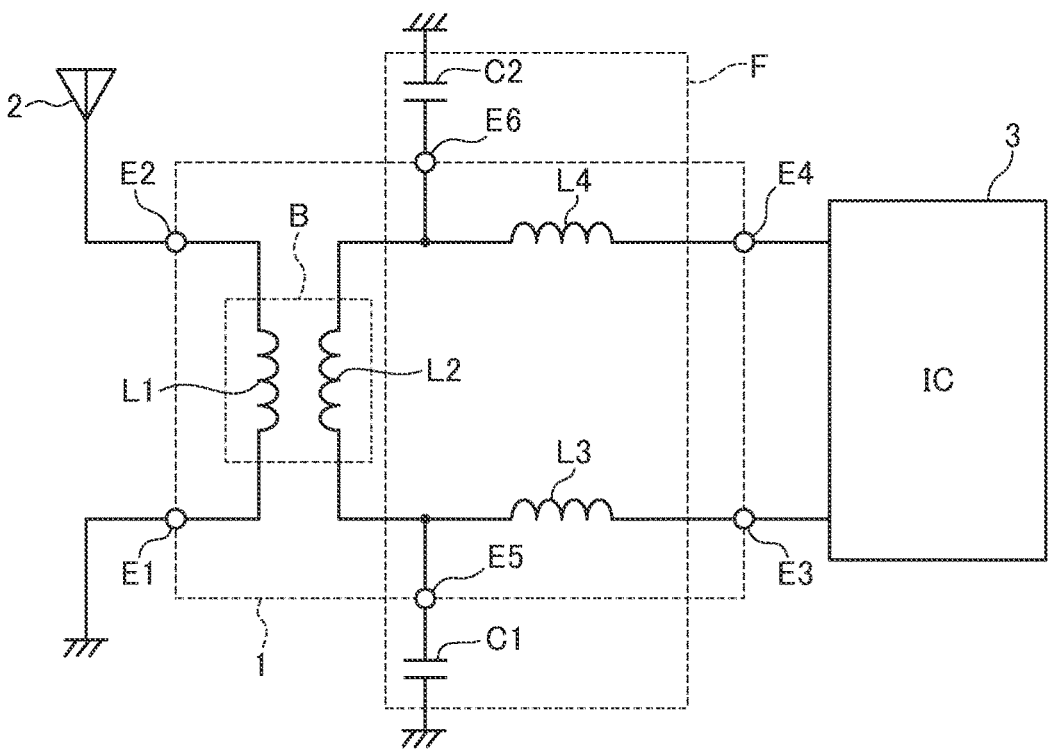
FIG. 1 is a circuit diagram of a composite electronic component 1 according to an embodiment of the present invention.

FIG. 1 is a circuit diagram of a composite electronic component 1 according to an embodiment of the present invention.

As illustrated in FIG. 1, the composite electronic component 1 according to the present embodiment has six terminal electrodes E1 to E6 and four inductors L1 to L4. In actual use, the terminal electrode E1 is grounded, an antenna element 2 is connected to the terminal electrode E2, a semiconductor IC 3 is connected to the terminal electrodes E3 and E4, and capacitors C1 and C2 are connected respectively between the terminal electrode E5 and the ground and between the terminal electrode E6 and the ground. One end of the inductor L1 is connected to the terminal electrode E1 and the other end thereof is connected to the terminal electrode E2. One end of the inductor L2 is connected to the terminal electrode E5 and the other end thereof is connected to the terminal electrode E6. One end of the inductor L3 is connected to the terminal electrode E5 (one end of the inductor L2) and the other end thereof is connected to the terminal electrode E3. One end of the inductor L4 is connected to the terminal electrode E6 (the other end of the inductor L2) and the other end thereof is connected to the terminal electrode E4.

The inductors L1 and L2 are magnetically coupled to each other to function as a balun transformer B. The inductors L3, L4 and capacitors C1, C2 function as a low-pass filter F. Thus, an unbalanced signal received by the antenna element 2 is converted into a balanced signal by the balun transformer B, subjected to removal of an unnecessary high-frequency component by the low-pass filter F, and input to the semiconductor IC 3.

Figure 2:
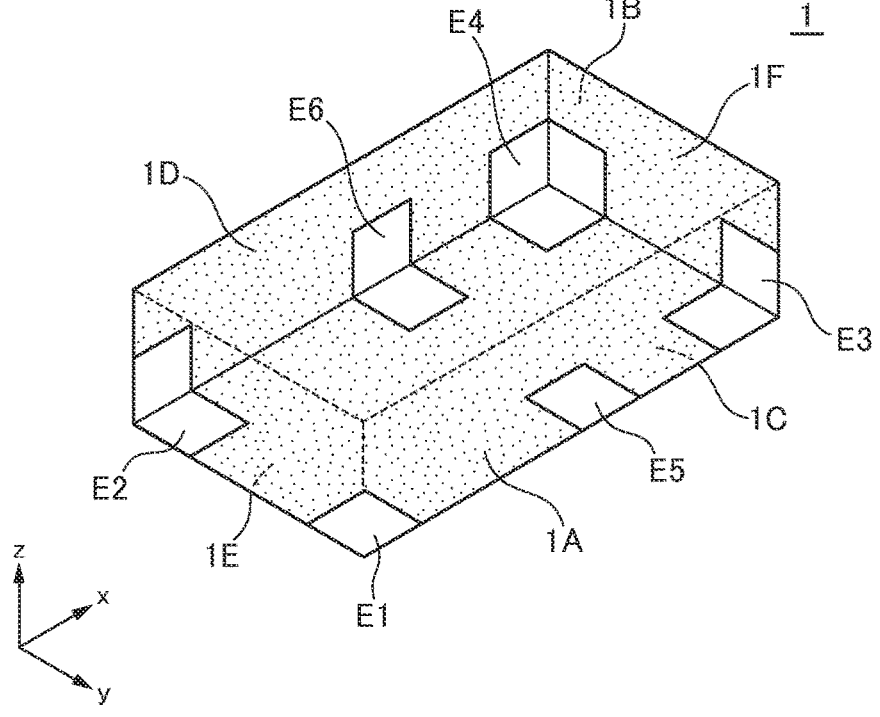
FIG. 2 is a schematic perspective view illustrating the outer appearance of the composite electronic component 1 according to the present embodiment.

FIG. 2 is a schematic perspective view illustrating the outer appearance of the composite electronic component 1 according to the present embodiment.

As illustrated in FIG. 2, the composite electronic component 1 according to the present embodiment is a surface-mountable single chip component and has a mounting surface 1A and a top surface 1B which constitute the xy plane and are positioned opposite to each other, side surfaces 1C and 1D which constitute the xz plane and are positioned opposite to each other, and side surfaces 1E and 1F which constitute the yz plane and are positioned opposite to each other. The terminal electrodes E1 to E6 are exposed to the mounting surface 1A, the terminal electrodes E1, E3, and E5 are exposed to the side surface 1C, the terminal electrodes E2, E4, and E6 are exposed to the side surface 1D, the terminal electrodes E1 and E2 are exposed to the side surface 1E, and the terminal electrodes E3 and E4 are exposed to the side surface 1F. In actual use, the mounting surface 1A is mounted so as to face a circuit board.

Figure 3:
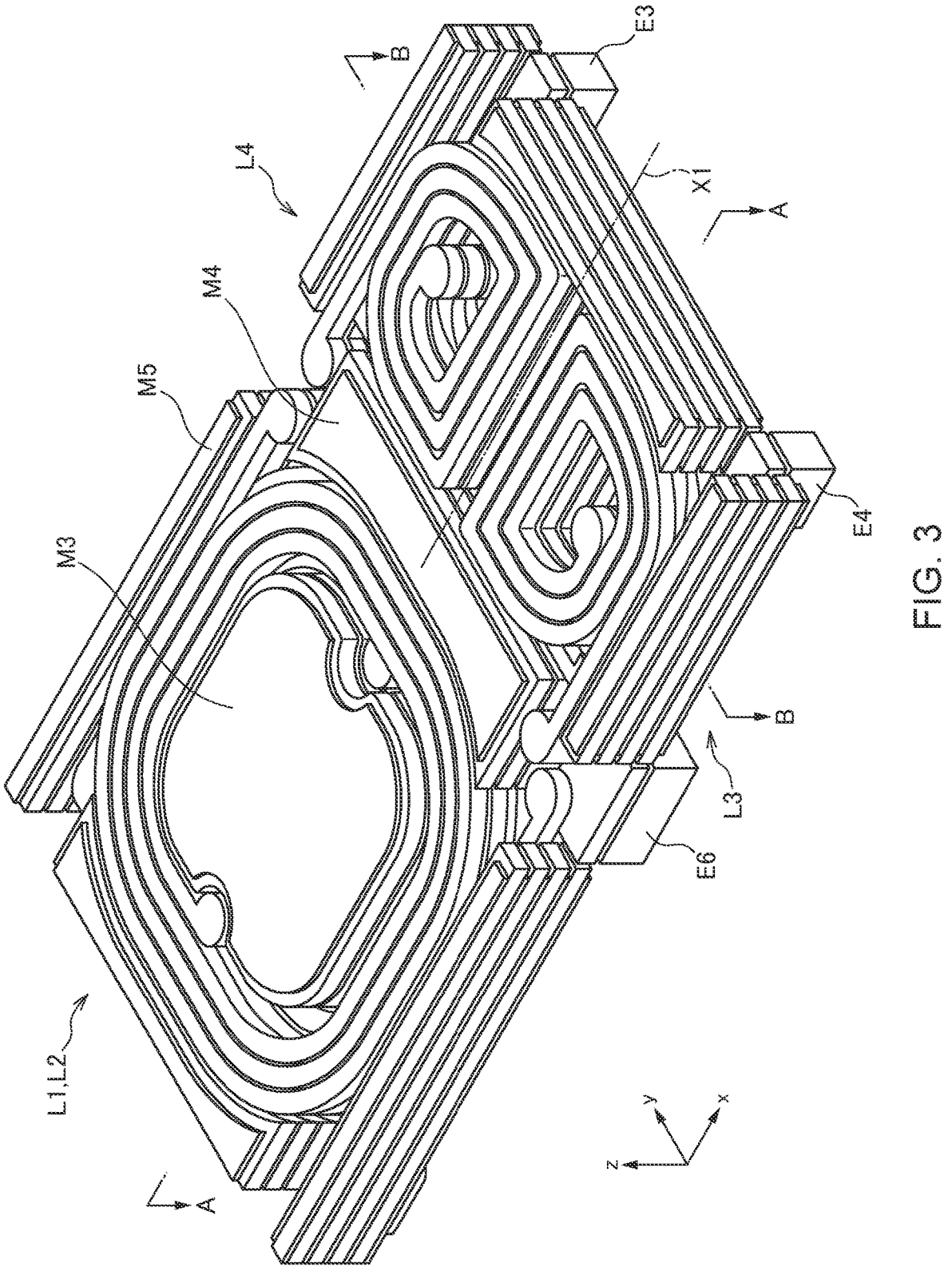
FIG. 3 is a schematic exploded perspective view for explaining the internal structure of the composite electronic component 1 according to the present embodiment.
Figure 4:
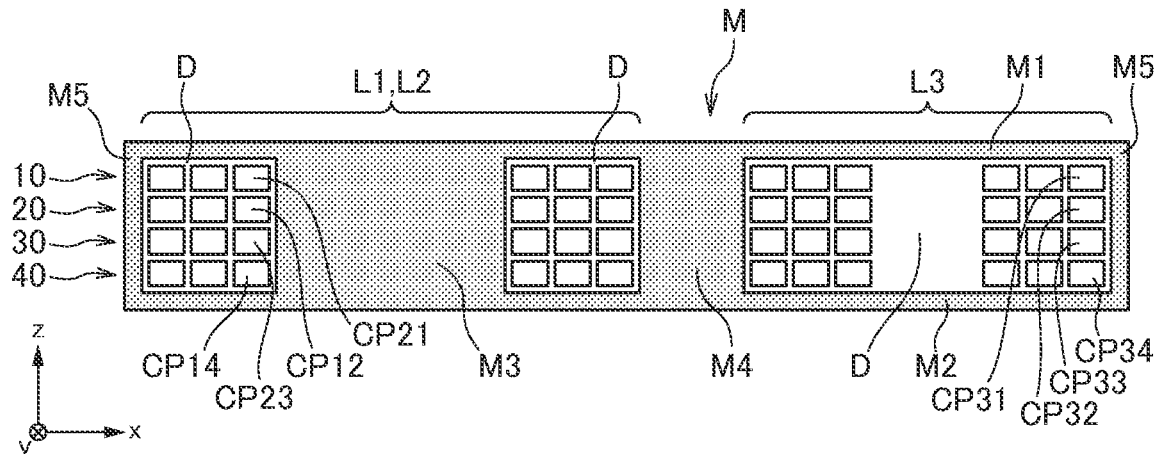
FIG. 4 is a schematic cross-sectional view taken along the line A-A in FIG. 3.

FIG. 3 is a schematic exploded perspective view for explaining the internal structure of the composite electronic component 1 according to the present embodiment. FIG. 4 is a schematic cross-sectional view taken along the line A-A in FIG. 3, and FIG. 5 is a schematic cross-sectional view taken along the line B-B in FIG. 3.

Figure 5:
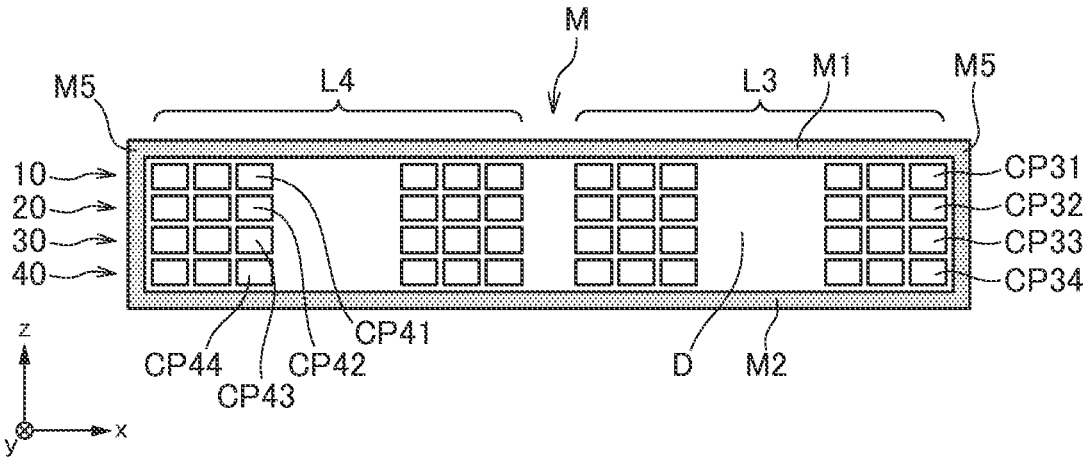
FIG. 5 is a schematic cross-sectional view taken along the line B-B in FIG. 3.

As illustrated in FIGS. 3 to 5, the composite electronic component 1 according to the present embodiment has four conductor layers 10, 20, 30, and 40 which are stacked in the z-direction. The inductor L1 is constituted of coil patterns CP12 and CP14 formed respectively in the conductor layers 20 and 40, the inductor L2 is constituted of coil patterns CP21 and CP23 formed respectively in the conductor layers 10 and 30, the inductor L3 is constituted of coil patterns CP31 to CP34 formed respectively in the conductor layers 10, 20, 30, and 40, and the inductor L4 is constituted of coil patterns CP41 to CP44 formed respectively in the conductor layers 10, 20, 30, and 40. The coil patterns CP21, CP12, CP23, and CP14 constituting the inductors L1 and L2 are arranged to overlap one another, the coil patterns CP31 to CP34 constituting the inductor L3 are arranged to overlap one another, and the coil patterns CP41 to CP44 constituting the inductor L4 are arranged to overlap one another.

The coil patterns CP31 to CP34 constituting the inductor L3 and the coil patterns CP41 to 44 constituting the inductor L4 are smaller in diameter than the coil patterns CP21, CP12, CP23, and CP14 constituting the inductors L1 and L2. Specifically, the diameter of the inductors L3 and L4 is half or less of the diameter of the inductors L1 and L2. A group of the coil patterns CP31 to CP34 and a group of the coil patterns CP41 to CP44 are arranged in the y-direction, and a group of the coil patterns CP21, CP12, CP23, and CP14 and a group of the coil patterns CP31 to CP34 and CP41 to CP44 are arranged in the x-direction. With this configuration, the planar size of the composite electronic component 1 is reduced. Further, the coil patterns CP31 to CP34 and the coil patterns CP41 to CP44 are symmetric in planar shape with respect to a virtual line X1 extending in the x-direction. As a result, the coil patterns CP31 to CP34 and the coil patterns CP41 to CP44 substantially coincide with each other in characteristics.

The coil patterns are covered with a magnetic element body M as an exterior body through an insulating layer D made of a resin material. The magnetic element body M is made of a magnetic material obtained by dispersing magnetic fillers in a resin material. The magnetic element body M includes a magnetic layer M1 covering the coil patterns from one side in the z-direction and constituting the top surface 1B, a magnetic layer M2 covering the coil patterns from the other side in the z-direction and constituting the mounting surface 1A, a magnetic pillar M3 embedded in the inner diameter areas of the coil patterns CP21, CP12, CP23, and CP14 and magnetically connecting the magnetic layers M1 and M2, a magnetic shield M4 provided between the section constituted by the coil patterns CP21, CP12, CP23, CP14 and the section constituted by the coil patterns CP31 to CP34 and CP41 to CP44 and magnetically connecting the magnetic layers M1 and M2, and a magnetic layer M5 constituting the side surfaces 1C to 1F. On the other hand, the inner diameter area of the coil patterns CP31 to CP34 and the inner diameter area of the coil patterns CP41 to CP44 are not provided with the magnetic element body M but are filled with the insulating layer D which is a nonmagnetic material.

The magnetic layers M1, M2, M5, the magnetic pillar M3, and the magnetic shield M4 function as a magnetic path for a magnetic field generated from the coil patterns CP21, CP12, CP23, and CP14 (inductors L1 and L2). This increases the inductances of the inductors L1 and L2. Further, the magnetic shield M4 has a role of reducing mutual magnetic interference between the section constituted by the coil patterns CP21, CP12, CP23, and CP14 (inductors L1 and L2) and the section constituted by the coil patterns CP31 to CP34 (inductor L3) and coil patterns CP41 to CP44 (inductor L4). Furthermore, the inductors L3 and L4 are covered with the magnetic layers M1 and M2 respectively from both sides in the z-direction, covered with the magnetic layer M5 from both sides in the y-direction, and covered with the magnetic shield M4 and magnetic layer M5 respectively from both sides in the x-direction, whereby the influence of external noise is reduced. Further, the inductors L3 and L4 each constitute an air-core coil whose inner diameter area is filled with the insulating layer D which is a nonmagnetic material, thus preventing magnetic saturation.

FIGS. 6 to 9 are schematic plan views for explaining the pattern shapes of the conductor layers 10, 20, 30, and 40, respectively.

Figure 6:
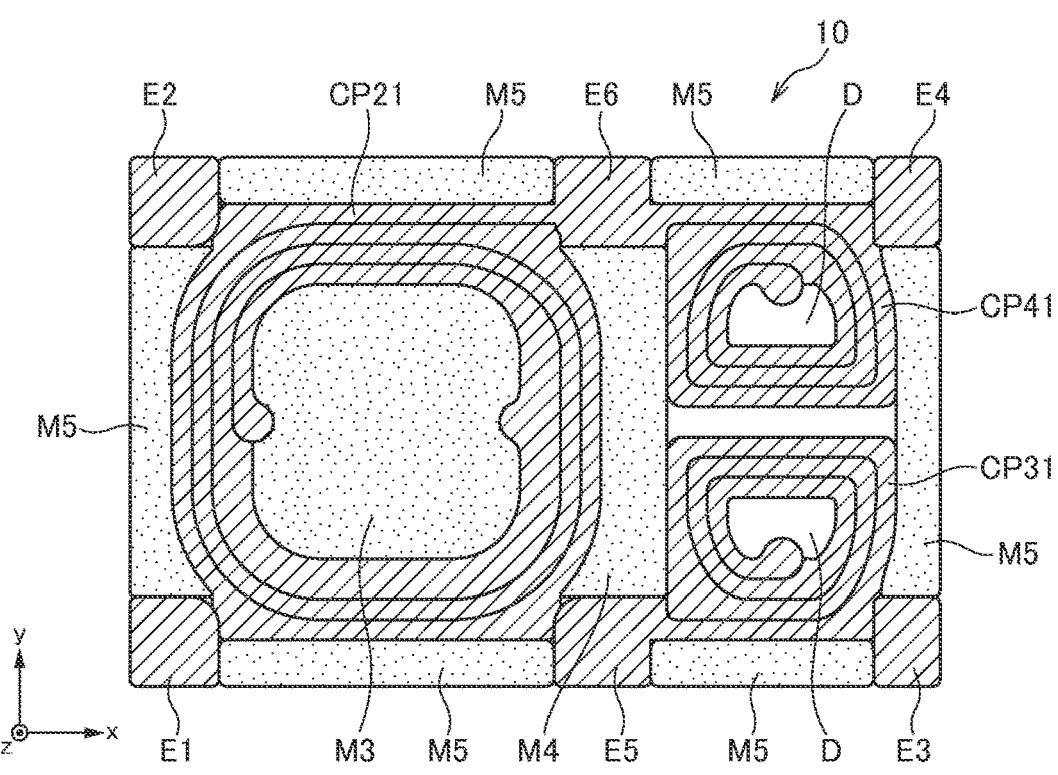
FIG. 6 is a schematic plan view for explaining the pattern shape of the conductor layer 10.
Figure 10:
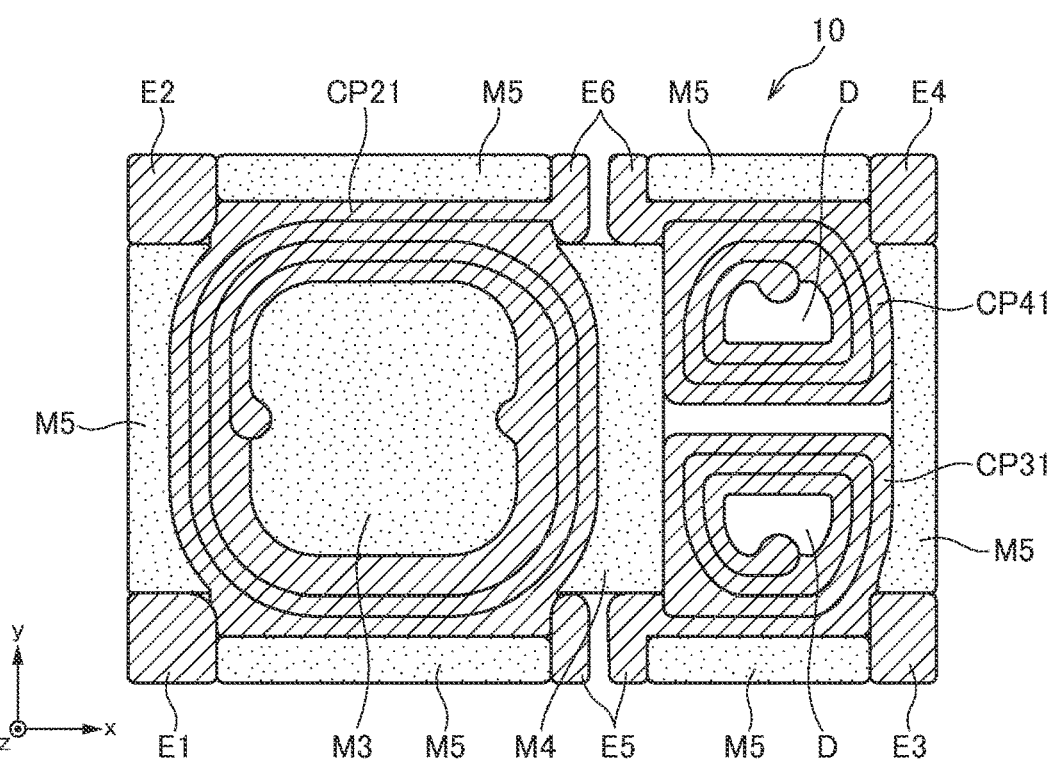
FIG. 10 is a schematic plan view for explaining the pattern shape of the conductor layer 10 according to a modification.

As illustrated in FIG. 6, the conductor layer 10 has the coil patterns CP21, CP31, and CP41 and the terminal electrodes E1 to E6. The outer peripheral ends of the coil patterns CP21 and CP41 are connected to the terminal electrode E6, and the outer peripheral end of the coil pattern CP31 is connected to the terminal electrode E5. The winding direction from the outer peripheral end to the inner peripheral end is the counterclockwise direction in the coil patterns CP21 and CP31 and the clockwise direction in the coil pattern CP41. The inner diameter area of the coil pattern CP21 includes a part of the magnetic pillar M3, and the area between the coil pattern CP21 and the coil patterns CP31, CP41 includes a part of the magnetic shield M4. Further, the area between the terminal electrodes adjacent in the x-direction or y-direction includes a part of the magnetic layer M5. As illustrated in FIG. 10, the terminal electrode E6 positioned in the conductor layer 10 may be divided into a part connected to the coil pattern CP21 and a part connected to the coil pattern CP41. The terminal electrode E5 positioned in the conductor layer 10 may also be divided into two.

Figure 7:
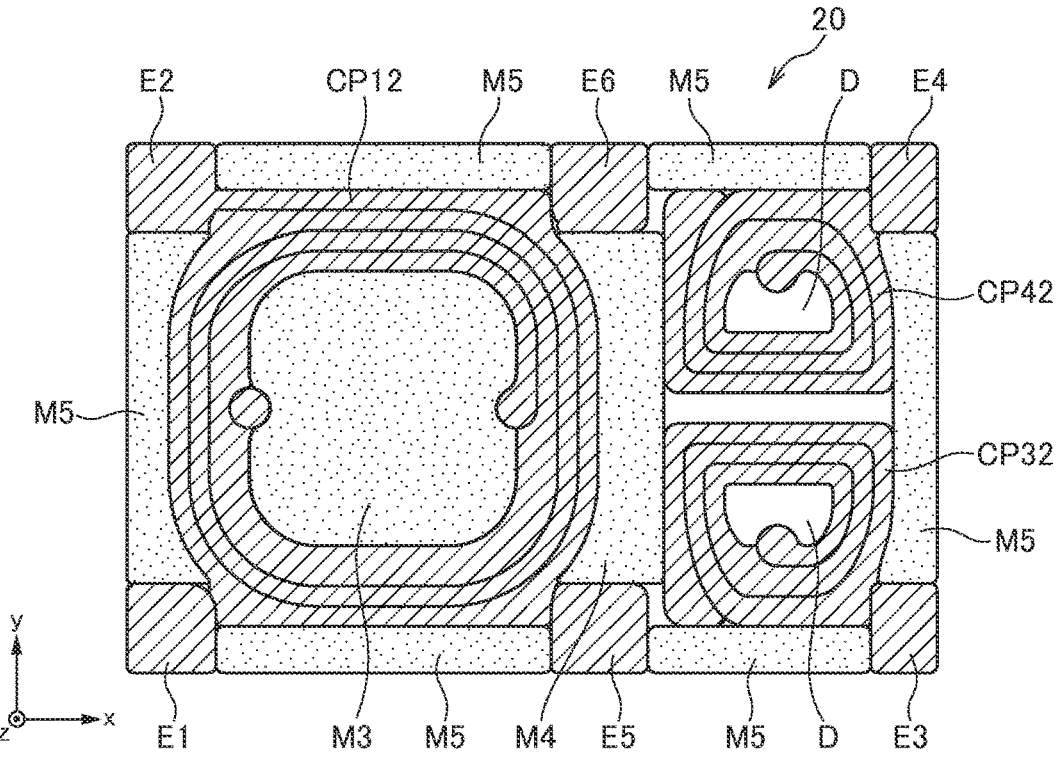
FIG. 7 is a schematic plan view for explaining the pattern shape of the conductor layer 20.
Figure 11:
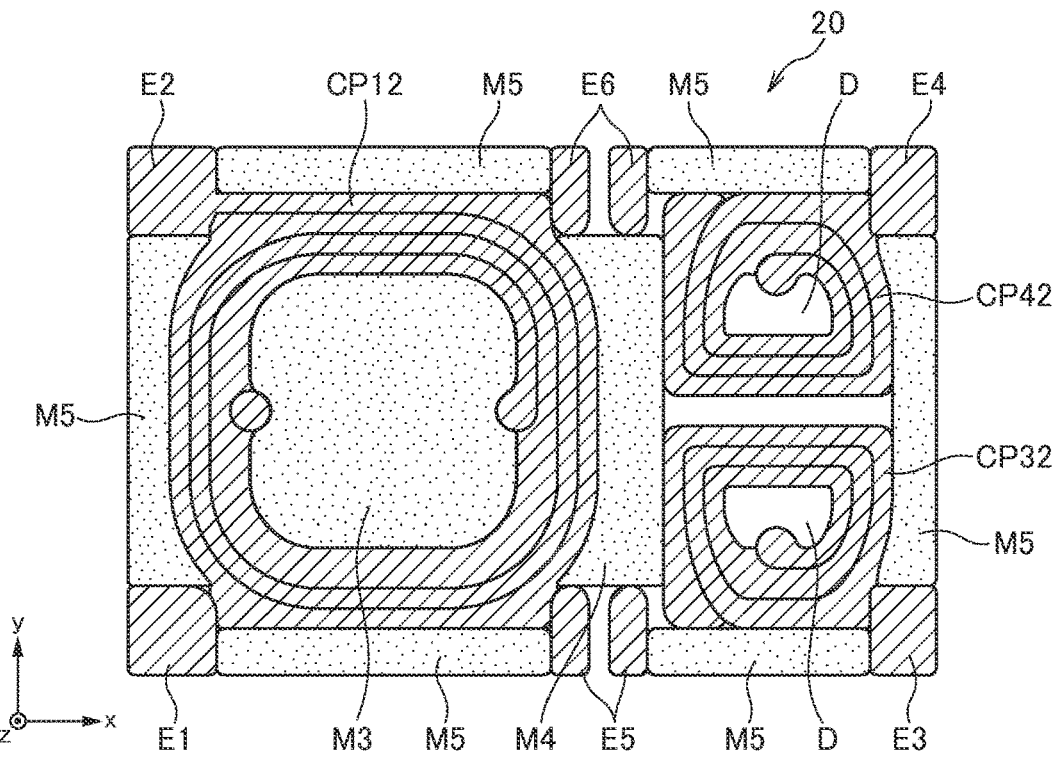
FIG. 11 is a schematic plan view for explaining the pattern shape of the conductor layer 20 according to a modification.

As illustrated in FIG. 7, the conductor layer 20 has the coil patterns CP12, CP32, and CP42 and the terminal electrodes E1 to E6. The outer peripheral end of the coil pattern CP12 is connected to the terminal electrode E2, the inner peripheral end of the coil pattern CP32 is connected to the inner peripheral end of the coil pattern CP32, and the inner peripheral end of the coil pattern CP42 is connected to the inner peripheral end of the coil pattern CP41. The winding direction from the outer peripheral end to the inner peripheral end is the clockwise direction in the coil patterns CP12 and CP32 and the counterclockwise direction in the coil pattern 42. The inner diameter area of the coil pattern CP12 includes a part of the magnetic pillar M3, and the area between the coil pattern CP12 and the coil patterns CP32, CP42 includes a part of the magnetic shield M4. Further, the area between the terminal electrodes adjacent in the x-direction or y-direction includes a part of the magnetic layer M5. As illustrated in FIG. 11, the terminal electrodes E5 and E6 positioned in the conductor layer 20 may each be divided into two.

Figure 8:
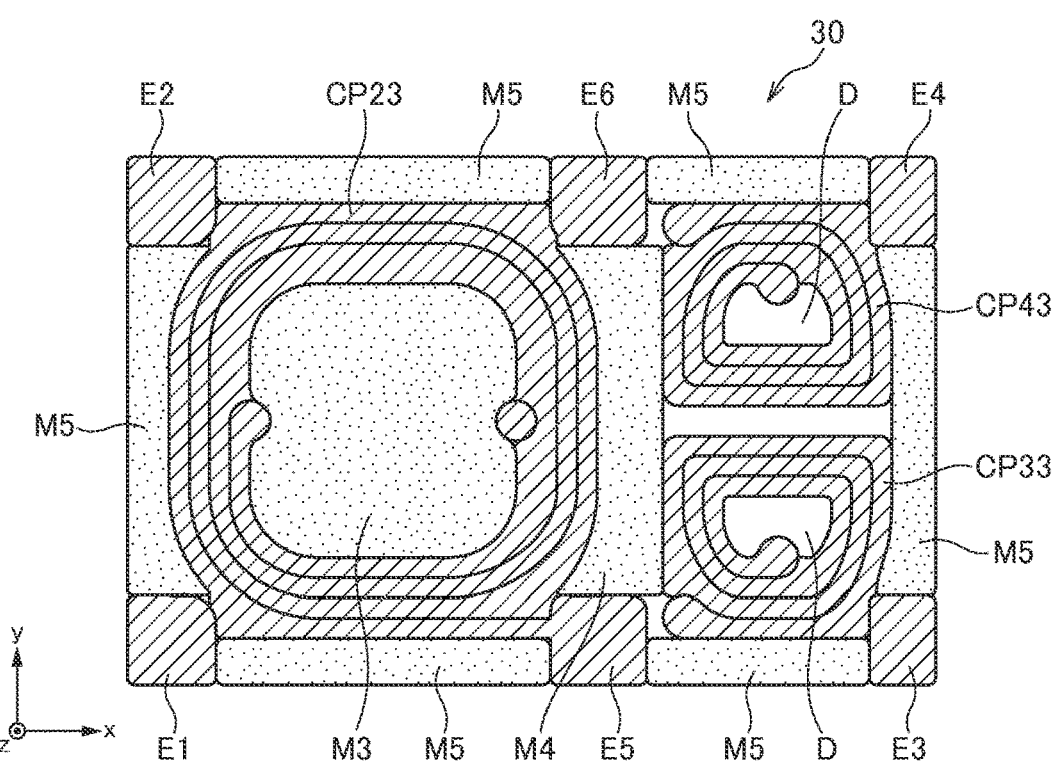
FIG. 8 is a schematic plan view for explaining the pattern shape of the conductor layer 30.
Figure 12:
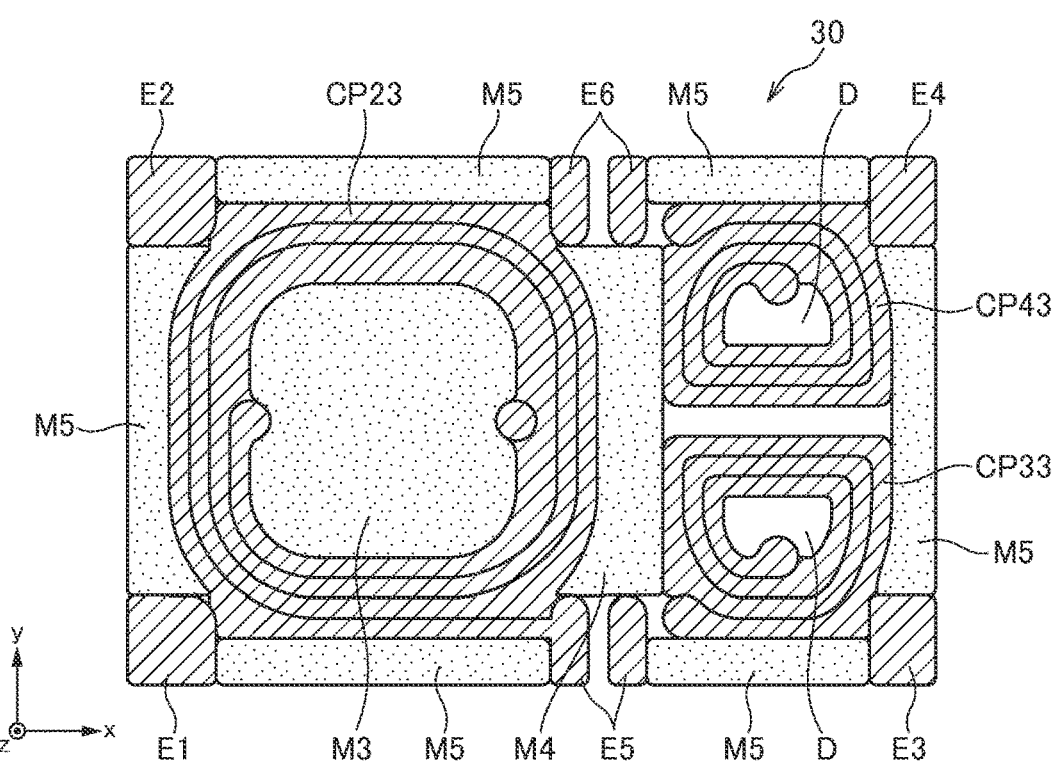
FIG. 12 is a schematic plan view for explaining the pattern shape of the conductor layer 30 according to a modification.

As illustrated in FIG. 8, the conductor layer 30 has the coil patterns CP23, CP33, and CP43 and the terminal electrodes E1 to E6. The outer peripheral end of the coil pattern CP23 is connected to the terminal electrode E5, the inner peripheral end of the coil pattern CP23 is connected to the inner peripheral end of the coil pattern CP21, the inner peripheral end of the coil pattern CP33 is connected to the inner peripheral end of the coil pattern CP32, and the inner peripheral end of the coil pattern CP43 is connected to the inner peripheral end of the coil pattern CP42. The winding direction from the outer peripheral end to the inner peripheral end is the clockwise direction in the coil patterns CP23 and CP43 and the counterclockwise direction in the coil pattern 33. The inner diameter area of the coil pattern CP23 includes a part of the magnetic pillar M3, and the area between the coil pattern CP23 and the coil patterns CP33, CP43 includes a part of the magnetic shield M4. Further, the area between the terminal electrodes adjacent in the x-direction or y-direction includes a part of the magnetic layer M5. As illustrated in FIG. 12, the terminal electrodes E5 and E6 positioned in the conductor layer 30 may each be divided into two.

Figure 9:
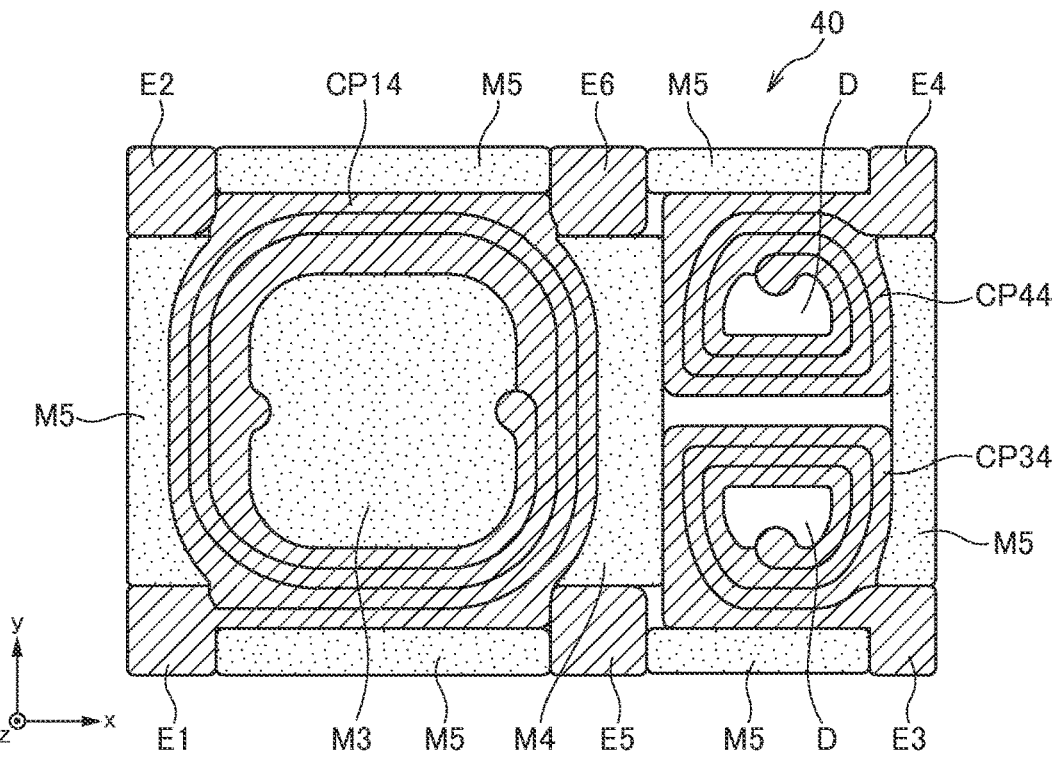
FIG. 9 is a schematic plan view for explaining the pattern shape of the conductor layer 40.
Figure 13:
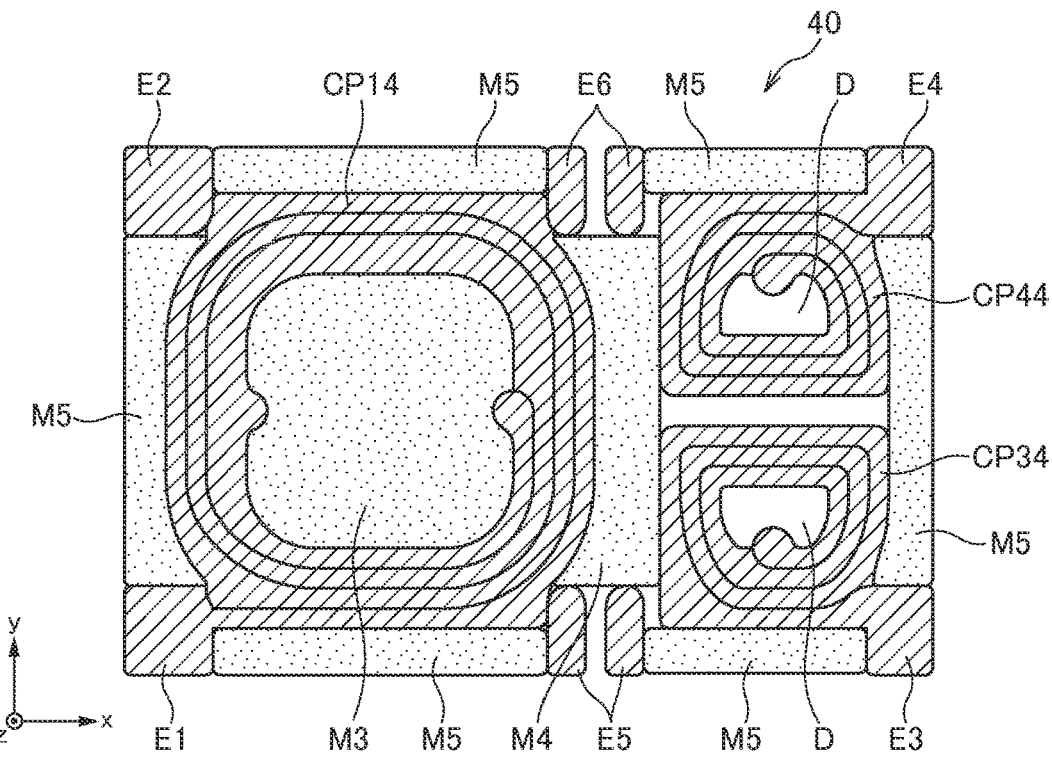
FIG. 13 is a schematic plan view for explaining the pattern shape of the conductor layer 40 according to a modification.

As illustrated in FIG. 9, the conductor layer 40 has the coil patterns CP14, CP34, and CP44 and the terminal electrodes E1 to E6. The outer peripheral end of the coil pattern CP14 is connected to the terminal electrode E1, the inner peripheral end of the coil pattern CP14 is connected to the inner peripheral end of the coil pattern CP12, the outer peripheral end of the coil pattern CP34 is connected to the terminal electrode E3, the inner peripheral end of the coil pattern CP34 is connected to the inner peripheral end of the coil pattern CP33, the outer peripheral end of the coil pattern CP44 is connected to the terminal electrode E4, and the inner peripheral end of the coil pattern CP44 is connected to the inner peripheral end of the coil pattern CP43. The winding direction from the outer peripheral end to the inner peripheral end is the counterclockwise direction in the coil patterns CP14 and CP44 and the clockwise direction in the coil pattern 34. The inner diameter area of the coil pattern CP14 includes a part of the magnetic pillar M3, and the area between the coil pattern CP14 and the coil patterns CP34, CP44 includes a part of the magnetic shield M4. Further, the area between the terminal electrodes adjacent in the x-direction or y-direction includes a part of the magnetic layer M5. As illustrated in FIG. 13, the terminal electrodes E5 and E6 positioned in the conductor layer 40 may each be divided into two.

With the above configuration, the winding direction (counterclockwise direction) of the coil patterns CP14 and CP12 starting from the terminal electrode E1 and the winding direction (clockwise direction) of the coil patterns CP23 and CP21 starting from the terminal electrode E5 are opposite to each other. Further, the winding direction (clockwise direction) of the coil patterns CP31 to CP34 starting from the terminal electrode E3 and the winding direction (counterclockwise direction) of the coil patterns CP41 to CP44 starting from the terminal electrode E4 are opposite to each other.

Thus, when current flows from the terminal electrode E2 toward the terminal electrode E1, the current flows from the terminal electrode E4 toward the terminal electrode E3 due to magnetic coupling between the inductors L1 and L2 constituting the balun transformer B, and an unbalanced signal is converted into a balanced signal. At this time, the direction of the current and the layout of the terminal electrodes on the unbalanced side (input side) coincide with those on the balanced side (output side), so that it is possible to simplify the layout of winding patterns on a substrate mounting the composite electronic component 1 according to the present embodiment.

When current flows from the terminal electrode E4 toward the terminal electrode E3, the direction of a magnetic field generated in the inner diameter areas of the coil patterns CP31 to CP34 constituting the inductor L3 and the direction of a magnetic field generated in the inner diameter areas of the coil patterns CP41 to CP44 constituting the inductor L4 coincide with each other. Thus, the magnetic field from the inductor L3 and the magnetic field from the inductor L4 cancel each other, reducing magnetic coupling between the inductors L3 and L4, which in turn reduces mutual interference between the inductors L3 and L4.

As described above, in the composite electronic component 1 according to the present embodiment, the coil patterns CP21, CP12, CP23, and CP14 (inductors L1 and L2) functioning as the balun transformer B and the coil patterns CP31 to CP34 (inductor L3) and coil patterns CP41 to CP44 (inductor L4) functioning as a part of the low-pass filter F are provided in the same conductor layers, respectively. This makes it possible to reduce the number of conductor layers and to reduce mutual interference between the balun transformer and the inductor.

Figure 14:
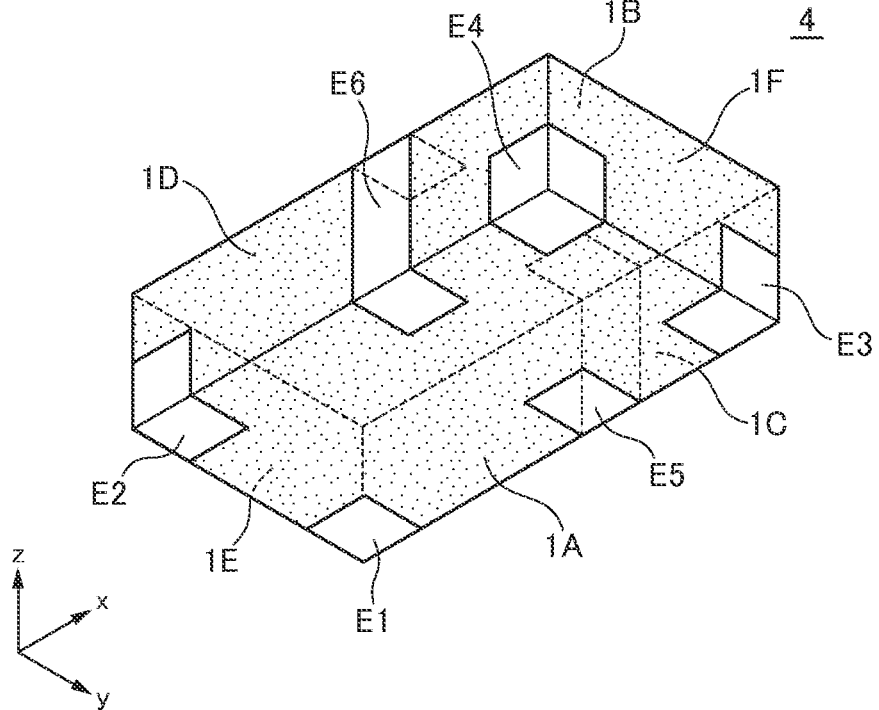
FIG. 14 is a schematic perspective view illustrating the outer appearance of a composite electronic component 4 according to a modification.

FIG. 14 is a schematic perspective view illustrating the outer appearance of a composite electronic component 4 according to a modification.

The composite electronic component 4 illustrated in FIG. 14 differs from the composite electronic component 1 according to the above embodiment in that the terminal electrodes E5 and E6 are exposed not only to the mounting surface 1A but also to the top surface 1B. When the terminal electrodes E5 and E6 are thus exposed to the top surface 1B, it is possible to mount a passive component, such as a capacitor, on the top surface 1B.

While the preferred embodiment of the present invention has been described, the present invention is not limited to the above embodiment, and various modifications may be made within the scope of the present invention, and all such modifications are included in the present invention.

What is claimed is:

1. A composite electronic component comprising:
first, second, third, and fourth terminal electrodes;
a first coil pattern formed on at least a first conductor layer, the first coil pattern having one end coupled to the first terminal electrode and other end coupled to the second terminal electrode;
a second coil pattern formed on at least a second conductor layer, the second coil pattern having one and other ends;
a third coil pattern formed on at least the first and second conductor layers, the third coil pattern having one end coupled to the one end of the second coil pattern and other end coupled to the third terminal electrode; and
a fourth coil pattern formed on at least the first and second conductor layers, the fourth coil pattern having one end coupled to the other end of the second coil pattern and other end coupled to the fourth terminal electrode,
wherein the third and fourth coil patterns are smaller in diameter than the first and second coil patterns,
wherein the third and fourth coil patterns are arranged in a first direction, and
wherein a group of the first and second coil patterns and a group of the third and fourth coil patterns are arranged in a second direction perpendicular to the first direction.

2. The composite electronic component as claimed in claim 1, wherein a winding direction of the third coil pattern starting from the third terminal electrode and a winding direction of the fourth coil pattern starting from the fourth terminal electrode are opposite to each other.

3. The composite electronic component as claimed in claim 1, wherein the third and fourth coil patterns are symmetric with respect to a virtual line extending in the second direction.

4. The composite electronic component as claimed in claim 1,
wherein the first and third terminal electrodes are exposed to a first side surface of the composite electronic component,
wherein the second and fourth terminal electrodes are exposed to a second side surface of the composite electronic component positioned opposite to the first side surface, and
wherein a winding direction of the first coil pattern starting from the first terminal electrode and a winding direction of the second coil pattern starting from the third terminal electrode are opposite to each other.

5. The composite electronic component as claimed in claim 1, wherein each of inner diameter areas of the first and second coil patterns is filled with a magnetic material.

6. The composite electronic component as claimed in claim 5, wherein each of inner diameter areas of the third and fourth coil patterns is filled with a nonmagnetic material.

7. The composite electronic component as claimed in claim 6, further comprising a magnetic shield made of a magnetic material provided between a group of the first and second coil patterns and a group of the third and fourth coil patterns.

8. The composite electronic component as claimed in claim 5, further comprising first and second magnetic layers made of a magnetic material, wherein the first, second, third, and fourth coil patterns are sandwiched between the first and second magnetic layers.

9. The composite electronic component as claimed in claim 1, further comprising third and fourth conductor layers, wherein the first, second, third, and fourth conductor layers are stacked in this order, wherein the first coil pattern is formed in the first and third conductor layers, wherein the second coil pattern is formed in the second and fourth conductor layers, wherein the third coil pattern is formed in the first, second, third, and fourth conductor layers, and wherein the fourth coil pattern is formed in the first, second, third, and fourth conductor layers.

10. The composite electronic component as claimed in claim 1, further comprising:

a fifth terminal electrode connected to the one end of the second coil pattern and the one end of the third coil pattern; and a sixth terminal electrode connected to the other end of the second coil pattern and the one end of the fourth coil pattern.

11. The composite electronic component as claimed in claim 10, wherein each of the fifth and sixth terminal electrodes is exposed to both surfaces on one and other sides in a stacking direction.

12. A composite electronic component comprising:

first, second, third, and fourth terminal electrodes;

a first inductor including a plurality of first coil patterns;

a second inductor including a plurality of second coil patterns;

a third inductor including a plurality of third coil patterns; and a fourth inductor including a plurality of fourth coil patterns, wherein the plurality of first coil patterns and the plurality of second coil patterns are alternately stacked at a first region, wherein the plurality of third coil patterns are stacked at a second region, wherein the plurality of fourth coil patterns are stacked at a third region, wherein the first inductor is connected between the first and second terminal electrodes, wherein the third inductor is connected between the third terminal electrode and one end of the second inductor, and wherein the fourth inductor is connected between the fourth terminal electrode and other end of the second inductor.

13. The composite electronic component as claimed in claim 12, wherein each of the second and third regions is smaller than the first region.

14. The composite electronic component as claimed in claim 13, wherein the second and third regions are arranged in a first direction, and wherein the first region and a group of the second and third regions are arranged in a second direction perpendicular to the first direction.

15. The composite electronic component as claimed in claim 12, wherein each of inner diameter areas of the first and second coil patterns is filled with a magnetic material, and wherein each of inner diameter areas of the third and fourth coil patterns is filled with a nonmagnetic material.

16. The composite electronic component as claimed in claim 12, further comprising:

a fifth terminal electrode connected to the one end of the second inductor; and a sixth terminal electrode connected to the other end of the second inductor.

* * * * *